(12) United States Patent
Daily et al.

(10) Patent No.: US 7,422,447 B2
(45) Date of Patent: Sep. 9, 2008

(54) ELECTRICAL CONNECTOR WITH STEPPED HOUSING

(75) Inventors: Christopher G. Daily, Harrisburg, PA (US); Douglas M. Johnescu, York, PA (US); Christopher J. Kolivoski, York, PA (US); Stuart C. Stoner, Lewisberry, PA (US)

(73) Assignee: FCI Americas Technology, Inc., Carson City, NV (US)

( * ) Notice: Subject to any disclaimer, the term of this patent is extended or adjusted under 35 U.S.C. 154(b) by 592 days.

(21) Appl. No.: 10/921,664

(22) Filed: Aug. 19, 2004

(65) Prior Publication Data

US 2007/0202715 A1   Aug. 30, 2007

(51) Int. Cl.
*H01R 12/00* (2006.01)

(52) U.S. Cl. .................................................. 439/83

(58) Field of Classification Search ............ 439/83, 439/71, 876, 66
See application file for complete search history.

(56) References Cited

U.S. PATENT DOCUMENTS

| | | | |
|---|---|---|---|
| 4,618,739 A | 10/1986 | Theobald | 174/52.4 |
| 5,102,829 A | 4/1992 | Cohn | 29/837 |
| 5,251,107 A | 10/1993 | Takemura et al. | 361/783 |
| 5,702,255 A | 12/1997 | Murphy et al. | 439/71 |
| 5,921,788 A | 7/1999 | Wilson et al. | 439/78 |
| 6,116,922 A | 9/2000 | Szu et al. | 439/83 |
| 6,139,336 A * | 10/2000 | Olson | 439/83 |
| 6,155,872 A | 12/2000 | Wu | 439/541.5 |
| 6,203,331 B1 | 3/2001 | McHugh et al. | 439/71 |
| 6,325,644 B1 | 12/2001 | Lemke et al. | 439/83 |
| 6,354,850 B1 | 3/2002 | Harper, Jr. et al. | 439/83 |
| 6,079,991 A1 * | 4/2002 | Scholz et al. | 439/342 |
| 6,425,785 B1 | 7/2002 | Azuma | 439/733.1 |
| 6,454,157 B2 * | 9/2002 | Olson | 228/180.21 |
| 6,699,048 B2 * | 3/2004 | Johnson et al. | 439/74 |
| 6,733,348 B2 | 5/2004 | Howell et al. | 439/884 |
| 6,735,508 B2 | 5/2004 | Winkler | 701/45 |
| 6,739,912 B2 | 5/2004 | Korsunsky et al. | 439/620 |
| 6,743,037 B2 * | 6/2004 | Kassa et al. | 439/342 |
| 6,769,924 B1 | 8/2004 | Korsunsky et al. | 439/83 |
| 6,769,936 B2 | 8/2004 | Gutierrez et al. | 439/676 |
| 6,793,504 B2 * | 9/2004 | Noda et al. | 439/71 |
| 7,059,873 B2 * | 6/2006 | Johnescu et al. | 439/83 |
| 7,168,964 B2 * | 1/2007 | Lemke et al. | 439/83 |
| 7,204,699 B2 * | 4/2007 | Stoner et al. | 439/71 |
| 7,226,296 B2 * | 6/2007 | Ngo | 439/71 |
| 2001/0015373 A1 | 8/2001 | Olson | 228/180.22 |
| 2002/0061687 A1 | 5/2002 | Cachina et al. | 439/874 |
| 2002/0063318 A1 | 5/2002 | Mitchell et al. | 257/678 |
| 2002/0167075 A1 | 11/2002 | Madrid | 257/666 |
| 2003/0132771 A1 | 7/2003 | Satoh et al. | 327/755 |

(Continued)

*Primary Examiner*—Phuong Nguyen
(74) *Attorney, Agent, or Firm*—Woodcock Washburn LLP

(57) ABSTRACT

A preferred embodiment of a ball-grid array connector includes a housing having a major surface with a first and a second portion. The housing has a first and a second penetration formed therein. The first and second penetrations adjoin the respective first and second portion of the major surface. The connector also includes a first and a second contact mounted on the housing and extending through the respective first and second penetrations. The connector further includes a first and a second fusible element attached to the respective first and second contacts. The first portion of the major surface is recessed so that the first fusible element is spaced apart from the housing.

17 Claims, 9 Drawing Sheets

U.S. PATENT DOCUMENTS

2004/0072456 A1   4/2004  Dozier, II et al. ............. 439/83
2006/0148283 A1*  7/2006  Minich et al. ................. 439/70
2007/0207649 A1*  9/2007  Geibel et al. ................. 439/157

* cited by examiner

ELECTRICAL CONNECTOR WITH STEPPED HOUSING

FIELD OF THE INVENTION

The present invention relates to electrical connectors of the type that are mounted on a substrate using multiple solder connections.

BACKGROUND OF THE INVENTION

Electrical connectors, such as ball-grid array (BGA) connectors, are commonly mounted on a substrate using multiple solder connections. The solder connections secured the connector to the substrate, and transmit electrical signals between the connector and the substrate.

The connector and the substrate typically operate at temperatures above ambient. Temperature changes can cause the connector and substrate to deflect, i.e., to expand or contract. (The amount of deflection of a component as a function of temperature change often is expressed as the coefficient of thermal expansion (CTE) for the component.) The amount of deflection experienced by the connector and substrate in response to a given temperature change usually differs. In other words, the CTE of the connector is usually different than that of the substrate.

Differences between the thermally-induced deflection of the connector and the substrate can induce stresses on the solder connections between the two components. These stresses, repeated over multiple heating and cooling cycles (referred to as "thermal cycling") can weaken the solder connections. Weakening of a solder connection can affect the integrity of the signal transmission through the solder connection, and in extreme cases can result in separation of the solder connection from the connector or the substrate.

Temperature increases, it is believed, typically cause a connector to expand outward from the center thereof. Hence, the greatest amount of deflection in a square or rectangular connector occurs at and near its outer corners. Moreover, it is believed that the greatest differences between the respective deflections of the connector and the underlying substrate occur at and near the outer corners of the connector. The solder connections associated with these locations therefore can be subject to relatively high stresses as a result of differential thermal expansion between the connector and the substrate.

SUMMARY OF THE INVENTION

A preferred embodiment of an electrical connector for mounting on a substrate comprises a housing having a major surface that faces the substrate when the connector is mounted on the substrate. The major surface has a first and a second portion. The first portion is recessed in relation to the second portion. The housing has a first and a second pocket formed therein. The first and second pockets extend inward from the respective first and second portions of the major surface.

The connector also comprises a first contact and a second contact each having a tail extending into the respective first and second pockets, and a first and a second fusible element attached to the respective first and second tails.

A portion of the first fusible element is positioned in the first pocket so that the portion of the first fusible element is spaced apart from surfaces of the housing that define the first pocket. A portion of the second fusible element is positioned in the second pocket so that the portion of the second fusible element contacts surfaces of the housing that define the second pocket.

A preferred embodiment of a ball-grid array connector comprises a housing having one or more surfaces that define a pocket within the housing, a contact mounted on the housing and comprising a tail that extends into the pocket, and a fusible element attached to the tail and extending into the pocket. The contact is positioned so that the fusible element is spaced apart from the one or more surfaces.

Another preferred embodiment of an electrical connector for mounting on a substrate comprises a first and a second contact, and a first and a second fusible element for forming connections between the respective first and second connectors and the substrate.

The electrical connector also comprises a housing. The housing has a major surface that faces the substrate when the connector is mounted on the substrate. The major surface has a first portion and a second portion. The first and second contacts are mounted on the housing so that the first and second contacts extend through penetrations associated within the respective first and second portions of the major surface.

The first portion of the major surface is recessed in relation to the second portion so that the connection formed by the first fusible element is spaced apart from the housing whereby the connection formed by the first fusible element can deflect in relation to the housing in response to relative movement between the housing and the substrate.

Another preferred embodiment of a ball-grid array connector comprises a housing comprising a major surface having a first and a second portion. The housing has a first and a second penetration formed therein. The first and second penetrations adjoin the respective first and second portion of the major surface. The connector also comprises a first and a second contact mounted on the housing and extending through the respective first and second penetrations.

The connector further comprises a first and a second fusible element attached to the respective first and second contacts. The first portion of the major surface is recessed so that the first fusible element is spaced apart from the housing.

A preferred method of assembling an electrical connector comprises inserting a contact into a housing of the connector, attaching a fusible element to the contact and the housing, and pushing the contact to separate the fusible element from the housing.

A preferred method comprises inserting a first contact to a first depth within in a housing of an electrical connector, inserting a second contact to a second depth within the housing, attaching a first and a second fusible element to the respective first and second contacts and to the housing, and subsequently pushing the first contact to the second depth within the housing.

BRIEF DESCRIPTION OF THE DRAWINGS

The foregoing summary, as well as the following detailed description of a preferred embodiment, are better understood when read in conjunction with the appended diagrammatic drawings. For the purpose of illustrating the invention, the drawings show an embodiment that is presently preferred. The invention is not limited, however, to the specific instrumentalities disclosed in the drawings. In the drawings.

DETAILED DESCRIPTION OF PREFERRED EMBODIMENTS

FIGS. 1-9 depict a preferred embodiment of an electrical connector 10. The figures are each referenced to a common coordinate system 11 depicted therein. The connector 10 is a BGA socket. This particular type of connector is disclosed for exemplary purposes only, as the principles of the present invention can be applied to other types of connectors.

Figure 8:
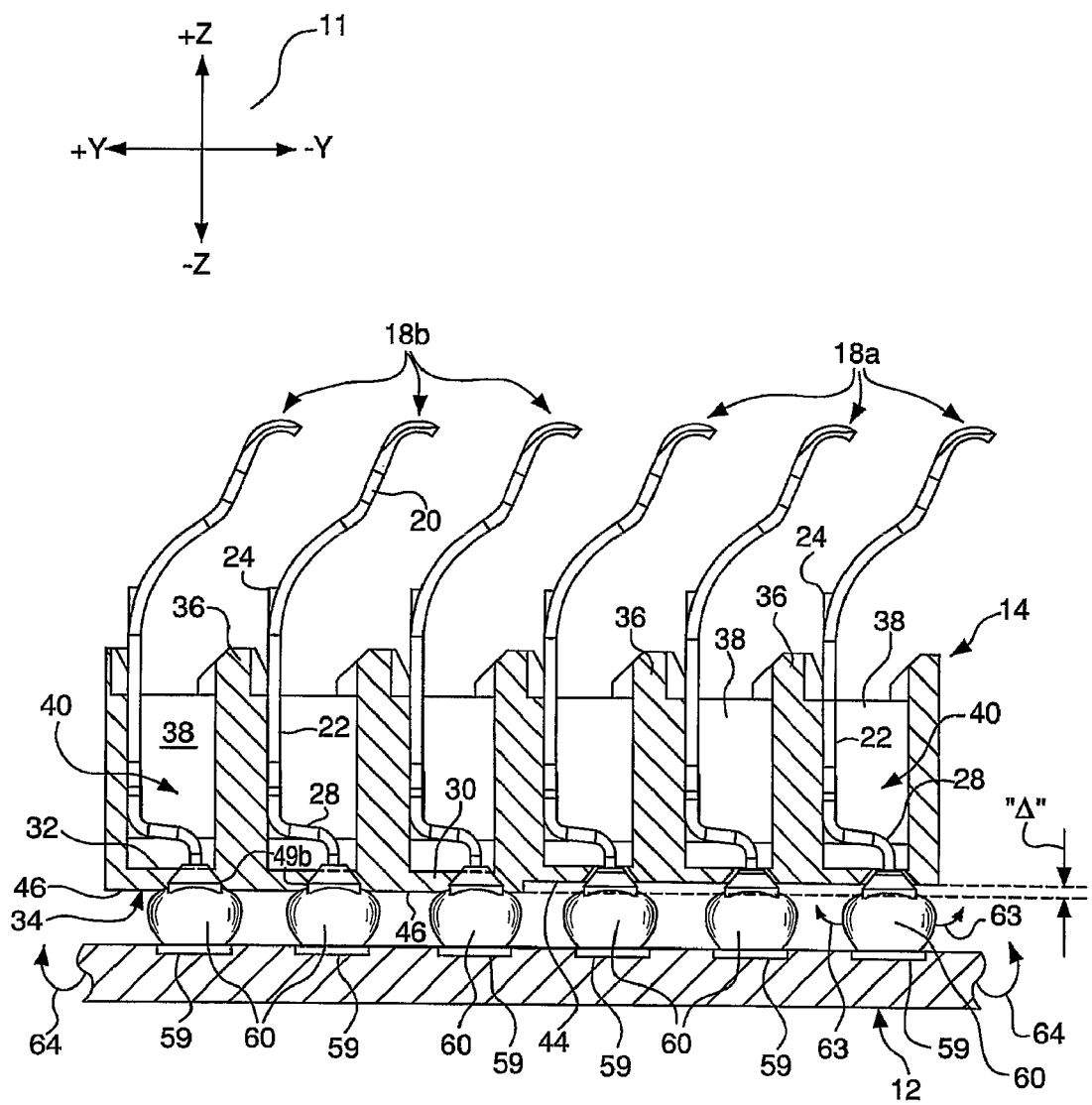
FIG. 8 is a cross-sectional side view of the area designated "E-E" in FIG. 1, depicting the connector mounted on a substrate, showing contacts of the connector in their lower positions.

The connector 10 can be mounted on a substrate 12 (see FIG. 8). The substrate 12 can be, for example, a printed circuit board, a printed wire board, a backplane, a motherboard, etc.

The connector 10 comprises a housing 14. The housing 14 is formed from a suitable electrically-insulative material such as plastic. The connector 10 also comprises a plurality of contacts 18a, 18b mounted on the housing 14. (The contacts 18a are substantially identical to the contacts 18b; different reference symbols are used to denote differences between the respective positions of the contacts 18a, 18b within the housing 14, as discussed below.)

The contacts 18a, 18b each include a contact portion 20, and an elongated body 22 (see FIGS. 4-8). The contact 20 adjoins a first end of the body 22. The body 22 includes a projection 24, and a curvilinear surface 26 that adjoins the projection 24 and the contact portion 20. Each contact 18 further comprises a substantially S-shaped tail 28 that adjoins a second end of the body 22.

(Directional terms such as top, bottom, upper, lower, etc., are used in reference to the component orientations depicted in FIG. 8. These terms are used for exemplary purposes only, and are not intended to limit the scope of the appended claims.)

The housing 14 includes a bottom portion 30 having an upper surface 32 and a lower (major) surface 34. The housing 14 also includes a plurality of ribs 36 that project from the upper surface 32, and a plurality of partitions 38 positioned between adjacent ones of the ribs 33 (see FIGS. 4-8). Opposing pairs of the ribs 36 and the associated partitions 38 define cavities 40 within the housing 14.

Figure 4:
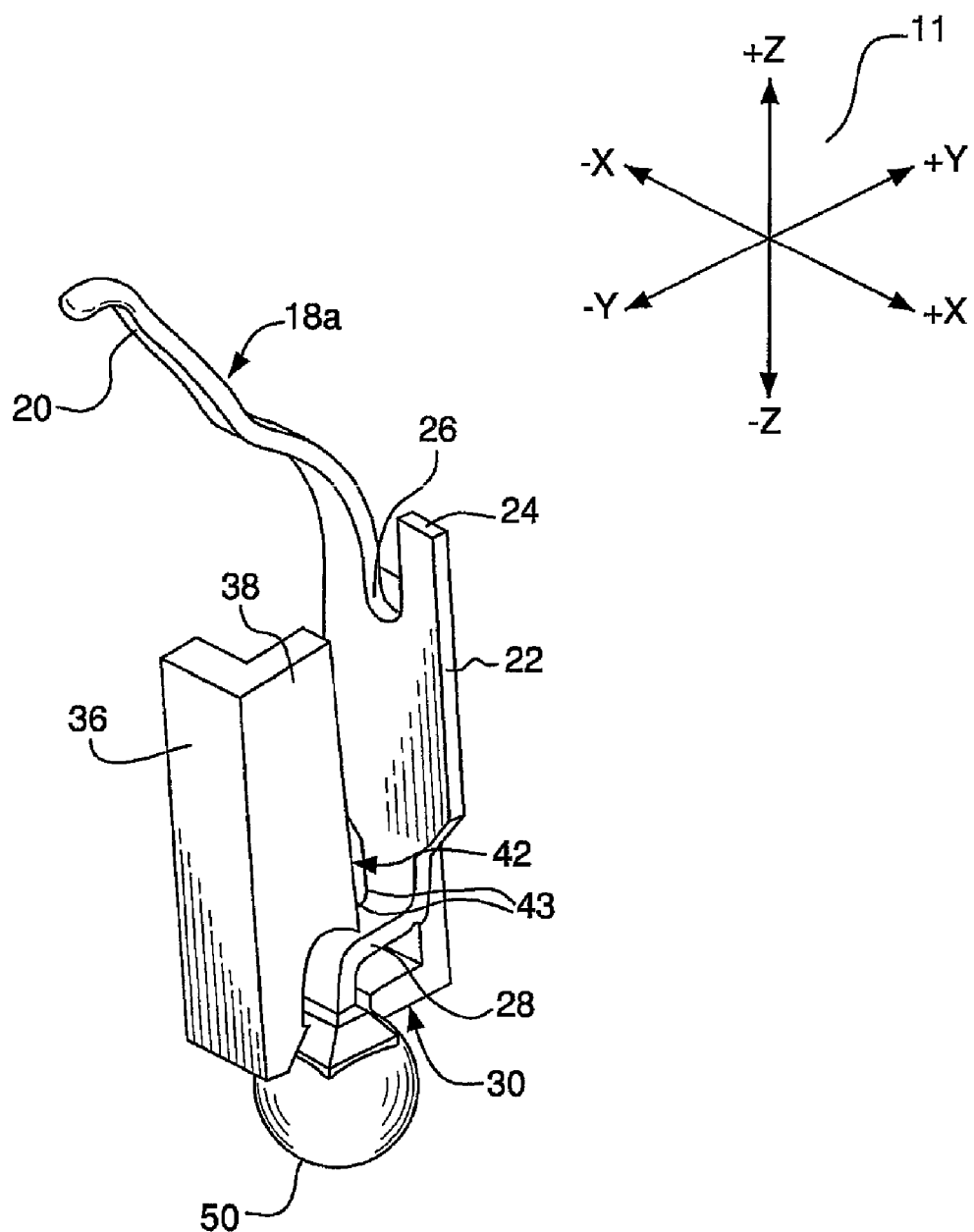
FIG. 4 is a top perspective, cross-sectional view taken through the line "B-B" of FIG. 1, showing one of the connector's contacts in its upper position.

The partitions 38 have slots 42 formed therein (see FIG. 4). Each slot 42 extends substantially in the vertical ("z") direction, and is defined by two beveled surfaces 43 of the partition 38 (see FIGS. 4, 5B, and 7B). Each slot 42 receives an outer edge of the body 22 of an associated contact 18a, 18b.

Figure 1:
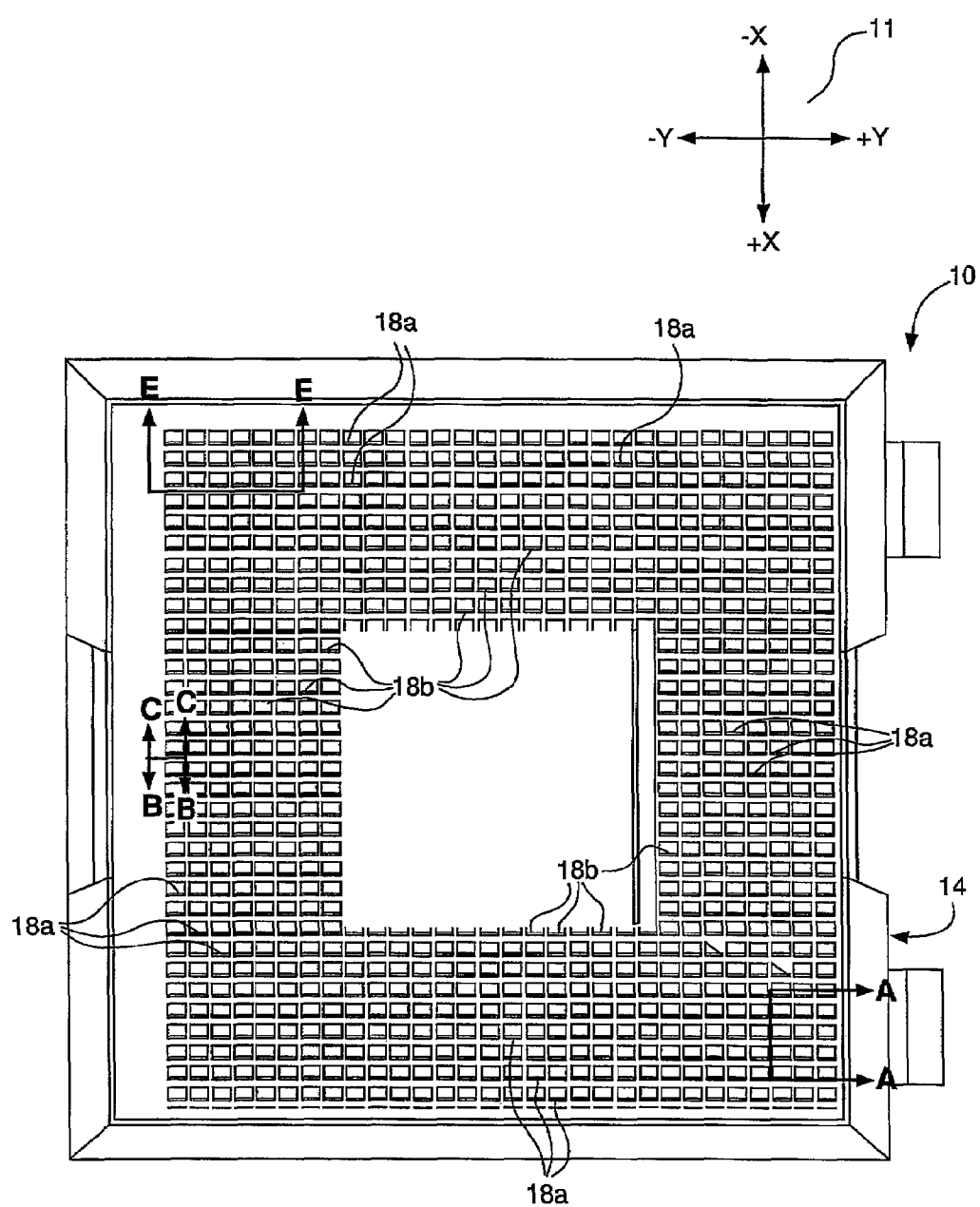
FIG. 1 is a top view of a preferred embodiment of an electrical connector.
Figure 2:
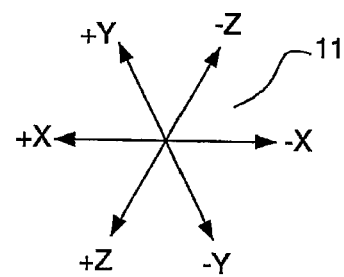
FIG. 2 is a bottom perspective view of a housing of the connector shown in FIG. 1.
Figure 2:
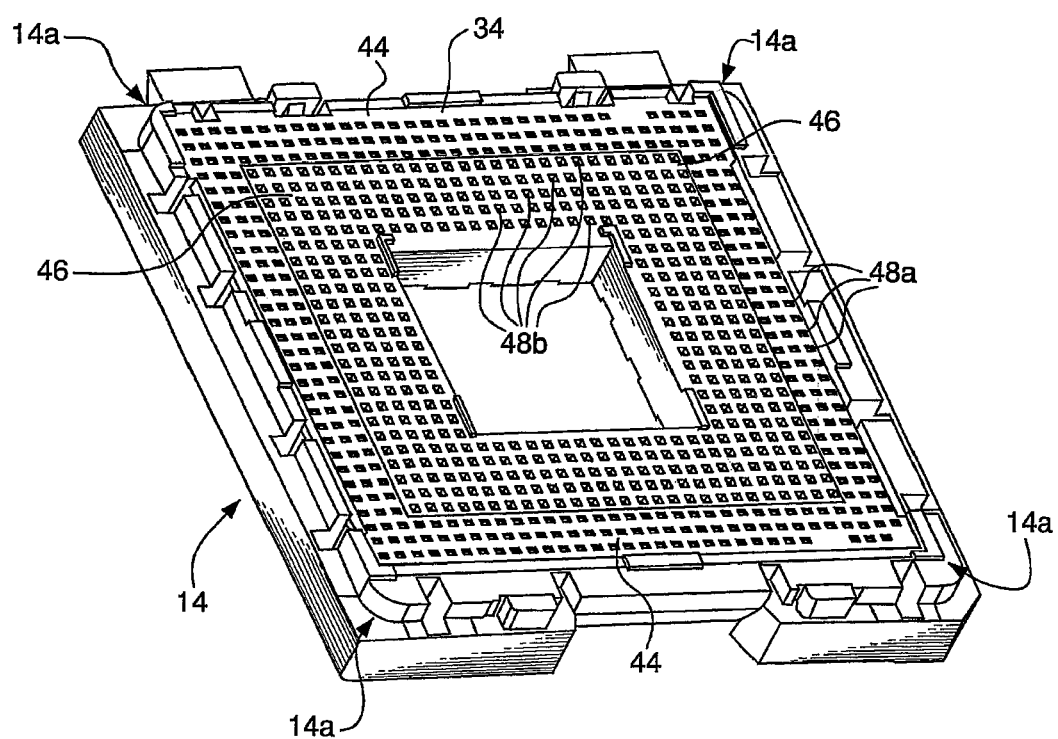
Figure 3:
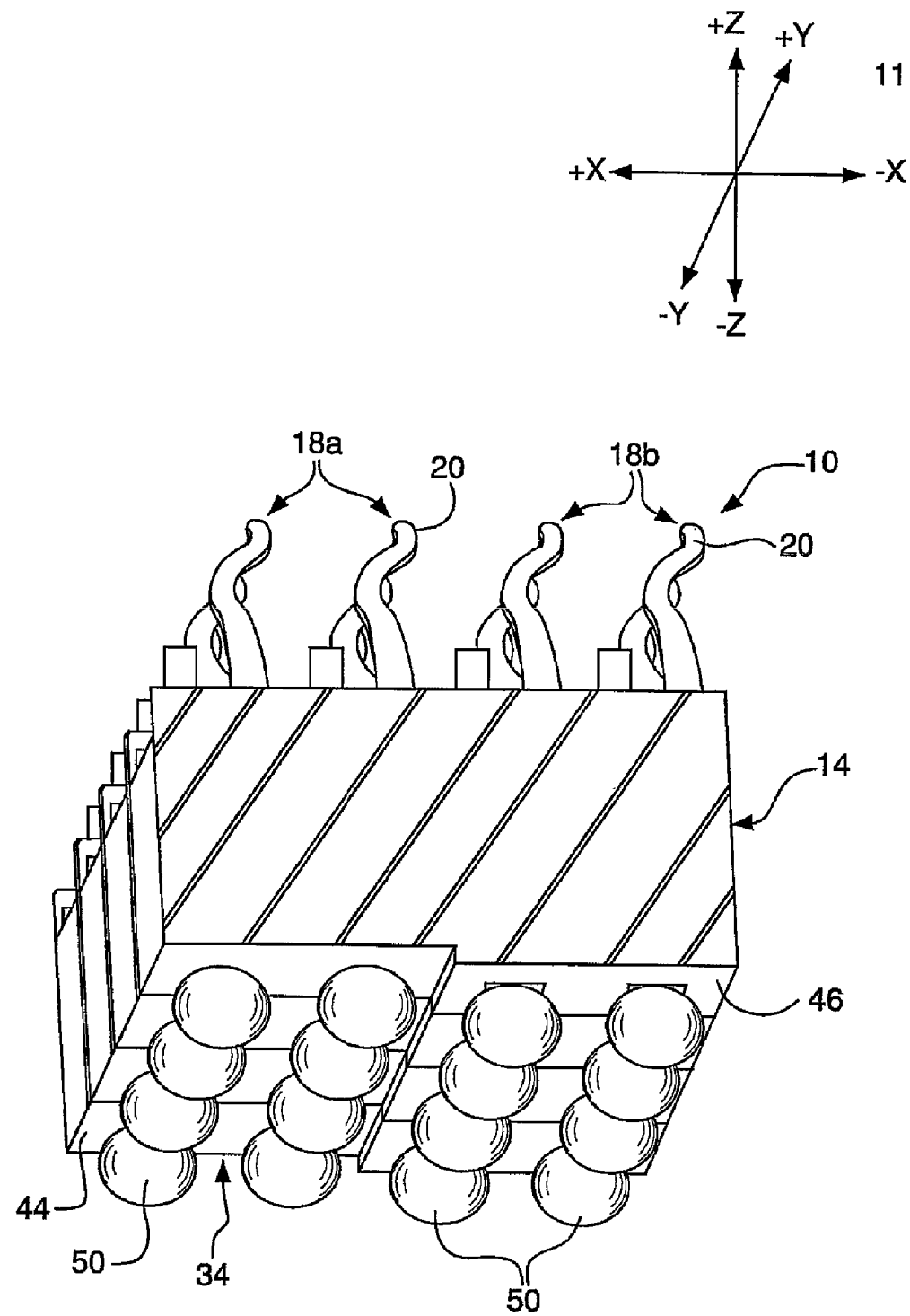
FIG. 3 is a bottom perspective, cross-sectional view taken through the line "A-A" of FIG. 1, showing two rows of the connector's contacts in their upper position.

The lower surface 34 has a first portion 44 and a second portion 46 (see FIG. 2). The first portion 44 is located outward of the second portion 46, and forms the outer periphery of the lower surface 34.

The first portion 44 is recessed in relation to the second portion 46. In particular, the first portion 44 is located substantially within a first plane, and the second portion 46 is located substantially within a second plane. The second plane is offset from the first plane so that the second portion 46 is stepped downward in relation to the first portion 44 (from the perspective of FIGS. 3-8). The offset between the first and second portions 44, 46 is approximately 0.13 mm (0.005 inch). The offset is denoted by the reference symbol "Δ" in FIG. 8. The optimal value for the offset is application dependent; a specific value is specified herein for exemplary purposes only.

A plurality of penetrations are formed in the bottom portion 30. The penetrations preferably are pockets 48a, 48b (see FIGS. 2 and 4-8). Each pocket 48a extends between the upper surface 32 and the first portion 44 of the lower surface 34. Each pocket 48b extends between the upper surface 32 and the second portion 46 of the lower surface 34. (The depth (z-axis dimension) of the pockets 48b therefore is greater than that of the pockets 48a.) The pockets 48a, 48b each adjoin a respective one of the cavities 40. The pockets 48a, 48b are arranged in a grid of equally-spaced rows, as shown in FIG. 2.

The relative proportions of the first and second portions 44, 46 are application dependent, and can vary in alternative embodiments. The total number of pockets 48a in relation to the total number pockets 48a also is application dependent, and can vary in alternative embodiments.

Figure 5B:
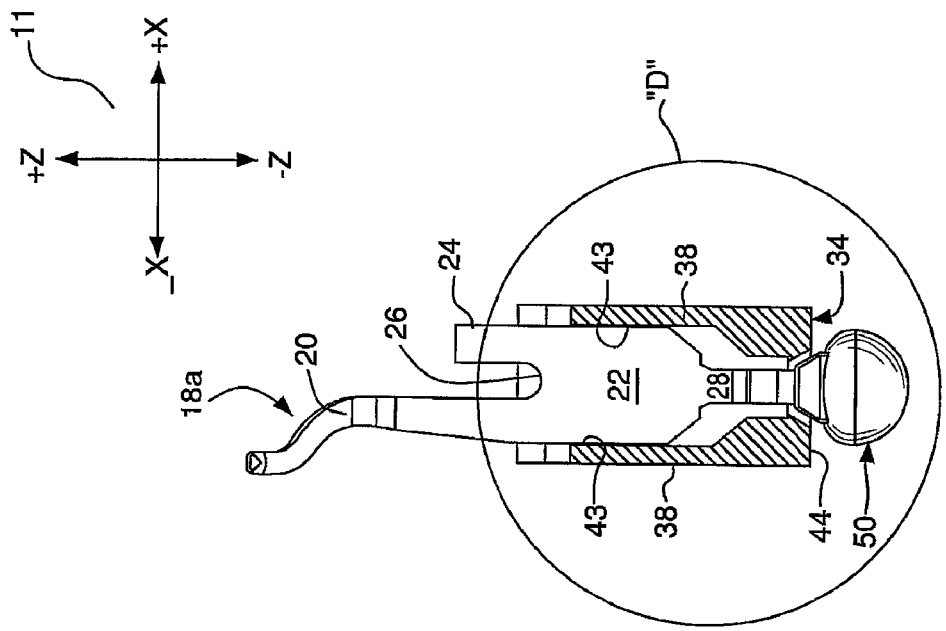
FIG. 5B is a side cross-sectional view of the area shown in FIG. 5A, from a perspective rotated ninety degrees in relation to FIG. 5A, showing the contact in its lower position.
Figure 5A:
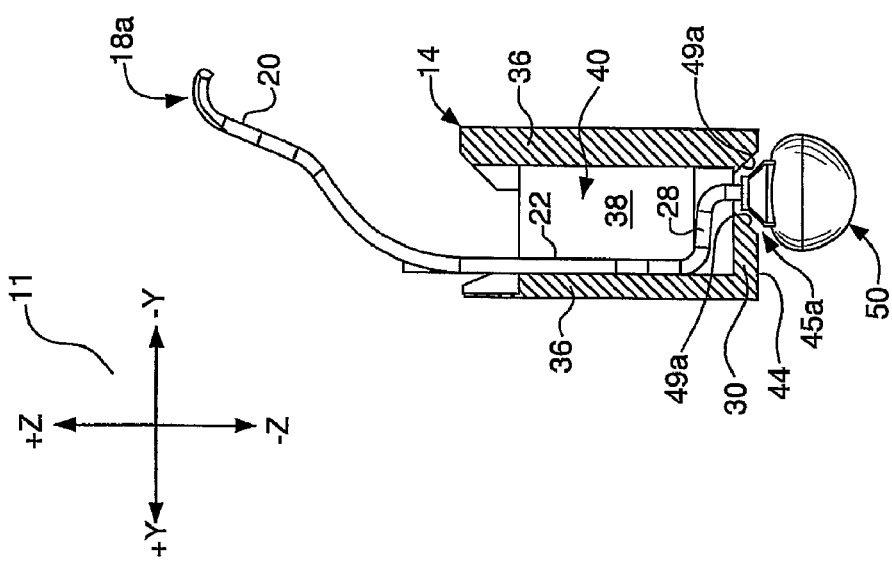
FIG. 5A is a side cross-sectional view taken through the line "C-C" of FIG. 1, showing one of the connector's contacts in its lower position.
Figure 6:
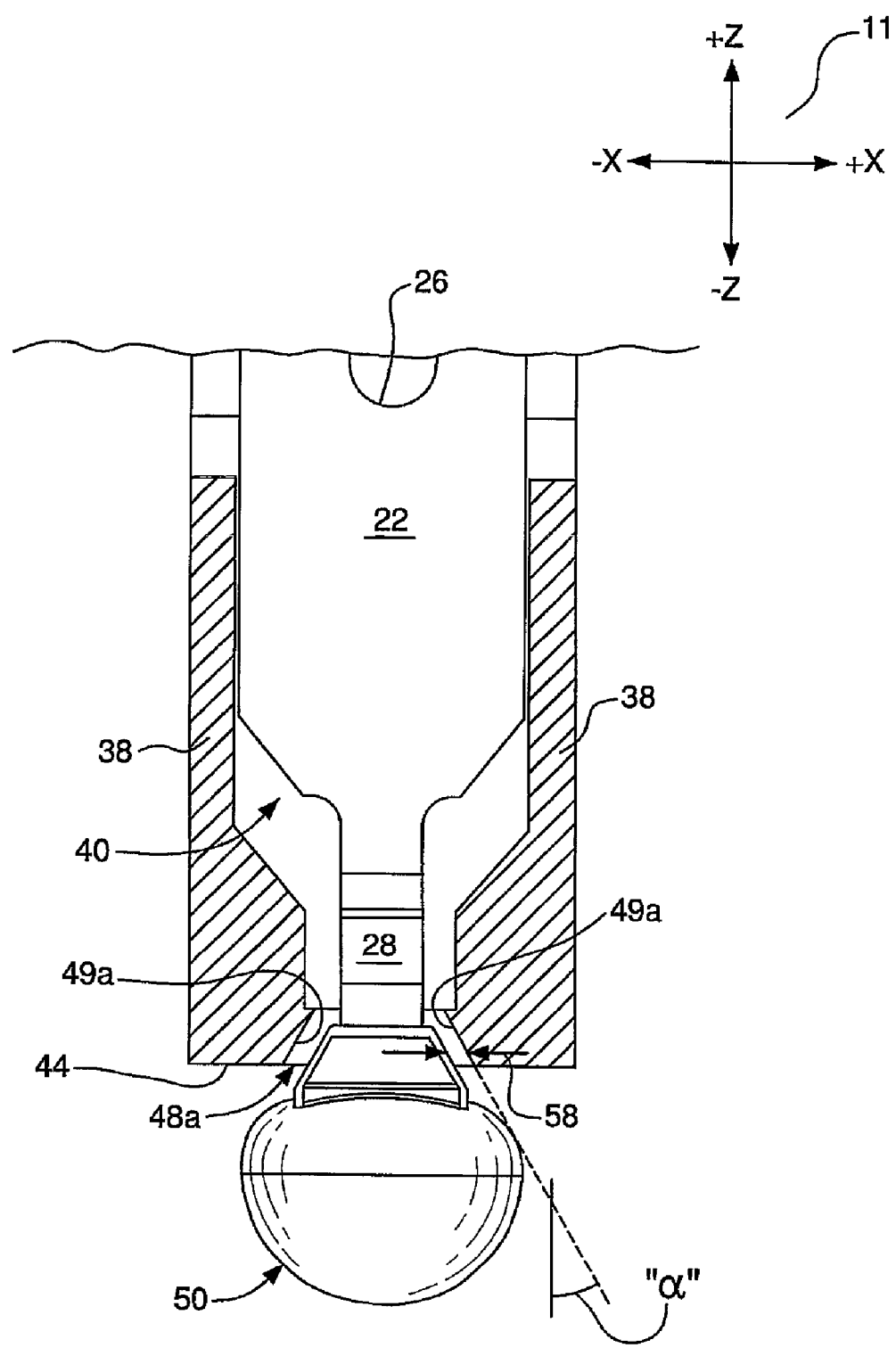
FIG. 6 is a magnified view of the area designated "D" in FIG. 5B.
Figure 7B:
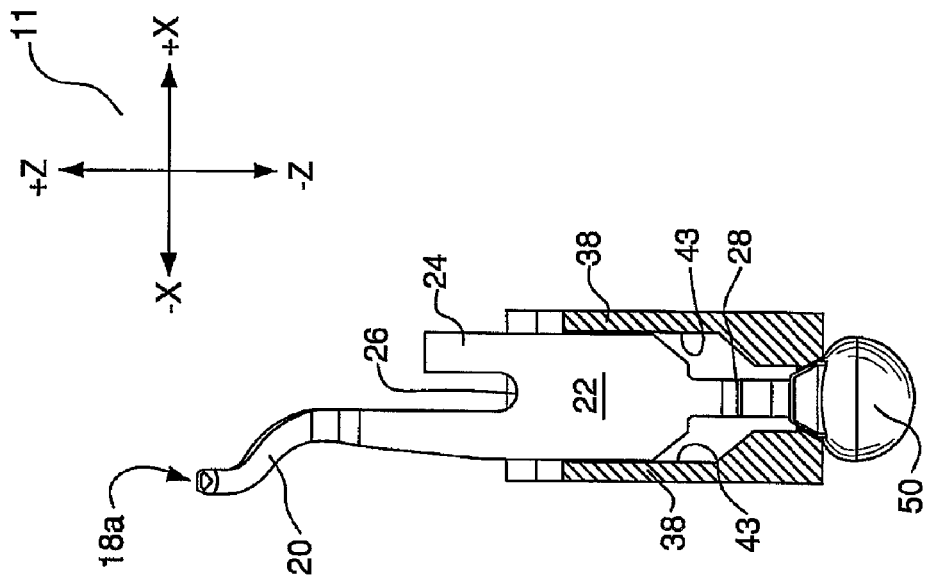
FIG. 7B is a view of the area shown in FIG. 5B, showing the contact in its upper position.
Figure 7A:
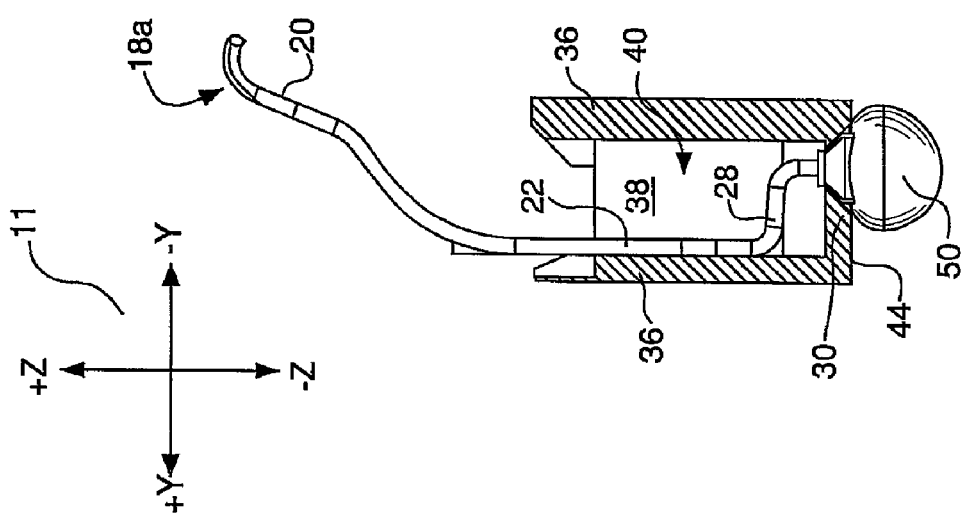
FIG. 7A is a view of the area shown in FIG. 5A, showing the contact in its upper position.

Each pocket 48a is defined by four adjoining surfaces 49a of the housing 14 (see FIGS. 5A and 6). Each pocket 48b is defined by four adjoining surfaces 49b (see FIG. 8). (The surfaces 49a, 49b thus act as walls of the respective pockets 48a, 48b.) Preferably, the surfaces 49a, 49b slope outward and downward so that the bottom of each pocket 48a, 48b is wider than the top thereof. The surfaces 49a, 49b preferably are angled approximately thirty degrees in relation the vertical ("z" axis) direction. The angle between the surfaces 49a and the vertical direction is denoted by the reference symbol "α" in FIG. 6. The optimal value for the angle α is application dependent; a specific value is specified herein for exemplary purposes only.

The cavities 40 receive the contacts 18a, 18b. In particular, the body 22 of each contact 18a, 18b is positioned substantially within a corresponding one the cavities 40 so that the adjoining tail 28 extends through the associated pocket 48a, 48b, and the contact portion 20 extends upward from the cavity 40 (see FIGS. 5A-8). The slots 42 associated with each cavity 40 receive opposing outer edges of the body 22. The beveled surfaces 43 that define each slot 42 contact an outer edge of the body 22, and help to restrain the associated contact 18a, 18b within the housing 14.

The connector 10 can mate with another connector (not shown) having contact pads or pin-type contacts. The contact pads or pin-type contacts can contact respective ones of the contact portions 20 of the contacts 18a, 18b.

The connector 10 further comprises a plurality of fusible elements in the form of solder balls 50. Each solder ball 50 is associated with a corresponding one of the contacts 18a, 18b. The solder balls 50 are each mounted on the tail 28 of a corresponding contact 18a, 18b. The solder balls 50 are positioned, in part, within a corresponding one of the pockets 48a, 48b of the housing 14 (see FIGS. 4-8). The solder balls 50 electrically and mechanically connect the connector 10 to the substrate 12, as discussed below.

Each solder ball 50 is attached to the tail 28 of an associated contact 18a, 18b through a reflow process. The reflow process melts the solder. A portion of the liquid solder settles into the associated pocket 48a, 48b and contacts the surfaces 49a, 49b. (The portion of the liquid solder that enters the pocket 48a, 48b thus assumes the approximate shape of the pocket 49a, 49b). The subsequent hardening of the solder around the associated tail 28 secures the solder ball 50 to the tail 28. (The solder balls 50 subsequently undergo a second reflow process that attaches the solder balls 50 to the substrate 12, as discussed below.)

The contacts 18a, 18b are inserted into their associated cavities 40 in the downward ("−z") direction. The contacts 18a, 18b can be inserted manually or, more preferably, using automated equipment commonly known to those skilled the field of connector deign. The contacts 18a, 18b can be pushed downward using, for example, tooling that engages the curvilinear surface 26.

The contacts 18b are initially inserted to their final position within the associated cavities 40. In other words, no further positioning of the contacts 18b takes place after the contacts 18b are initially inserted in the housing 14. (The "final position" of the contacts 18a, 18b refers to the vertical (z-axis) position of the contacts 18a, 18b during the second reflow process that attaches the solder balls 50 to the substrate 12. The final position of the contacts 18a is approximately equal to the final position of the contacts 18b, as discussed below.)

The contacts 18a, by contrast, are not initially inserted to their final (lower) position within the associated cavities 40. In particular, the contacts 18a are inserted to an initial (upper) position approximately 0.13 mm above their final position (see FIGS. 3, 4, 7A, and 7B). The offset between the initial and final positions of the contacts 18a corresponds approximately to the offset between the first and second surface portions 44, 46.

The solder balls 50 are subject to a first reflow process that attaches each solder ball 50 to the tail 28 of its associated contact 18a, 18b, as discussed above. The first reflow process is conducted with the contacts 18a in their initial positions, and with the contacts 18b in their final positions.

The contacts 18a are moved to their final positions after the solder balls 50 have re-hardened. In particular, the contacts 18a are pushed downward in the pockets 40 by a distance of approximately 0.13 mm. (The contacts 18a can be pushed downward manually or, more preferably, using the tooling that was utilized to insert the contacts 18a in their initial positions.) This action positions the contacts 18a in approximately the same vertical position as the contacts 18b (see FIGS. 5A-6, 8, and 9). Hence, tops of the contacts 18a, 18b are substantially even, and the solder balls 50 associated with the contacts 18a, 18b form a substantially co-planar array when the contacts 18a are moved to their final positions.

The downward force exerted on each contact 18a to move the contact 18a to its final position breaks the bond between the associated solder ball 50 and the surfaces 49a of the housing 14, and moves the uppermost portion of the solder ball 50 downward within the associated pocket 48a. A gap 58 thereby is formed between the solder ball 50 and each of the surfaces 49a (see FIG. 6). The gap 58 is approximately 0.065 mm (as measured in the "x" and "y" directions). The optimal value for the gap 58 is application dependent; a specific value is specified herein for exemplary purposes only.

The connector 10 at this point is ready to be mounted on the substrate 12. (Contact between the body 22 of the contacts 18a and the beveled surfaces 43 of the associated partitions 38 helps to retain the contact 18a in its final position before the connector 10 is mounted on the substrate 12.)

Figure 9:
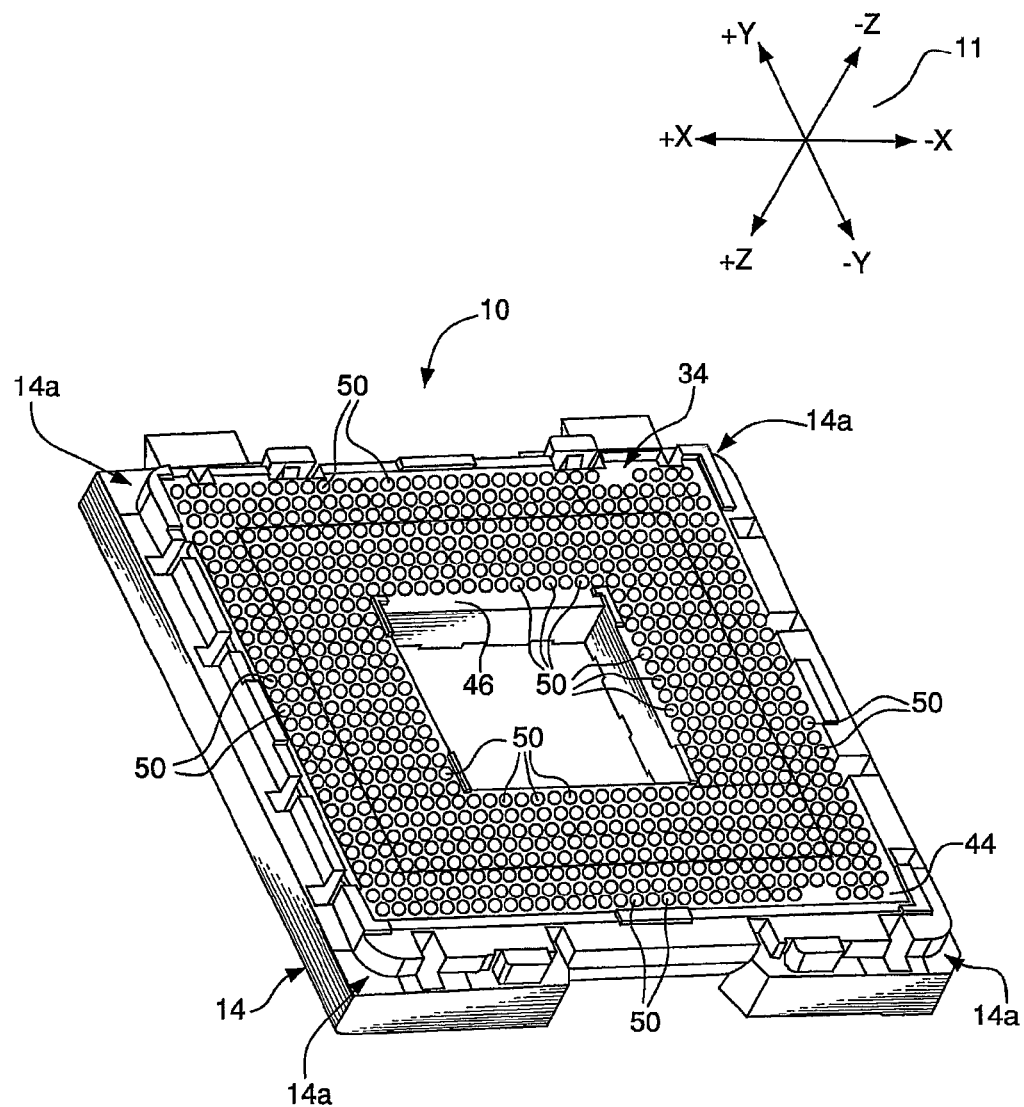
FIG. 9 is a bottom perspective view of the connector shown in FIGS. 1-8, showing contacts of the connector in their lower positions.

Each solder ball 50 substantially aligns with a corresponding contact pad 59 on the substrate 12 when the connector 10 is placed thereon (see FIG. 9). The solder balls 50 are subject to a second reflow process that melts the solder balls 50. The melting and subsequent re-hardening of the solder forms solder connections 60 between the tails 28 of the contacts 18a, 18b and the associated contact pads 59. The solder connections 60 facilitate transmission of electrical signals between the contacts 18a, 18b and the substrate 12. The solder connections 60 also secure the contacts 18a, 18b to the substrate 12.

The gap 58 can facilitate relative movement between the housing 14 and the solder connections 60 associated with the contacts 18a. This feature can help to isolate the solder connections 60 associated with the contacts 18a from the stresses induced by differential thermal expansion between the housing 14 and the substrate 12. In particular, the gap 58, in conjunction with the flexibility of the tail 28 of the associated contact 18a, permits the housing 14 to move laterally, i.e., in the "x-y" plane, without inducing substantial stresses on the solder connections 60.

The gap 58 substantially isolates the solder connections 60 direct contact with the housing 14 (provided that the relative movement between the housing 14 and the solder connections 60 remains less than the gaps 58). Hence, the surfaces 49a of the housing 14 do not push against the solder connections 60 when the housing 14 deflects in relation to the substrate 12, and a potential source of stress on the solder connections 60 is eliminated.

Moreover, the gap 58 permits the substrate 12 to bow in relation to the housing 14 without inducing substantial stresses on the solder connections 60. Bowing can occur in response to the weight of the connector 10 (or other downward-acting external loads) on the substrate 12. (Bowing of the substrate 12 is denoted by the arrows 64 in FIG. 8.)

The gap 58 can permit the solder connections 60 to rotate in relation to the "x" and "y" axes in response to bowing of the substrate 12. It is believed that the solder connections 60 can rotate approximately +/−thirty-two degrees from the position depicted in FIG. 8 before substantial contact occurs between the solder connections 60 and the surfaces 49a. The potential deflection in one of the solder balls 50 in response to bowing of the substrate 12 is denoted by the arrows 63 in FIG. 8. Hence, substantial bowing of the substrate 12 can occur before the solder connections 60 are subject to substantial stresses therefrom.

The differential thermal expansion between the housing 14 and the substrate 12 is believed to be maximal at or near outer corners 14a of the housing 14 (see FIGS. 2 and 9). Placing the contacts 18a near the outer periphery of the housing 14 therefore is believed to provide the maximum benefit with respect to eliminating or reducing thermally-induced stresses in the associated solder connections 60.

It is believed that the configuration of the connector 10 can reduce or eliminate stresses on the solder connections 60 induced by differences between the thermal expansion of the substrate 12 and the housing 14, and by bowing of the substrate 12. The configuration of the connector 10 therefore can help to preserve the integrity, and prolong the life of the mechanical and electrical connections between the connector 10 and the substrate 12.

The foregoing description is provided for the purpose of explanation and is not to be construed as limiting the invention. While the invention has been described with reference to preferred embodiments or preferred methods, it is understood that the words which have been used herein are words of description and illustration, rather than words of limitation. Furthermore, although the invention has been described herein with reference to particular structure, methods, and embodiments, the invention is not intended to be limited to the particulars disclosed herein, as the invention extends to all structures, methods and uses that are within the scope of the appended claims. Those skilled in the relevant art, having the benefit of the teachings of this specification, may effect numerous modifications to the invention as described herein, and changes may be made without departing from the scope and spirit of the invention as defined by the appended claims.

For example, a detailed description of the contacts 18a, 18b has been provided for exemplary purposes only. The principles of the invention can be applied to connectors having contacts of other configurations. Moreover, alternative embodiments of the connector 10 can be equipped with one or more insert molded lead assemblies (IMLAs).

Substantial variations in the configuration of the housing 14 also are possible. For example, alternative embodiments of the housing 14 can be formed with contact-retaining means other than the ribs 36 and the partitions 38. Alternative embodiments of the housing 14 also can be formed without the pockets 48a, 48b. The lower surface of alternative embodiments of the housing 14 can be recessed in a manner other than that described herein. For example, the lower surface can include four separate recessed portions each located at a corner of the lower surface.

What is claimed is:

1. An electrical connector for mounting on a substrate, comprising:
  a housing having a surface that faces the substrate when the connector is mounted on the substrate, the surface having a first and a second portion, the first portion being recessed in relation to the second portion, the housing having pocket walls that define a first and a second pocket formed therein, the first and second pockets extending inward from the respective first and second portions of the surface;
  a first contact and a second contact each having a tail extending into the respective first and second pockets; and
  a first and a second fusible element attached to the respective first and second tails, wherein the first fusible element is positioned outside of the first pocket so that there is a gap between the first fusible element and the housing surface and the pocket walls, and a portion of the second fusible element is positioned in the second pocket so that the portion of the second fusible element contacts the pocket walls that define the second pocket,
  wherein ends of the first and the second contacts are substantially coplanar.

2. The connector of claim 1, wherein the first fusible element is capable of forming a connection between the first contact and the substrate when the first fusible element is placed on the substrate and subjected to a reflow process, and the spacing between the first fusible element and the housing surface and pocket walls facilitates relative movement between the housing and the connection.

3. The connector of claim 1, wherein the first portion of the surface is positioned outward of the second portion of the surface.

4. The connector of claim 1, wherein the first portion of the surface is positioned proximate an outer periphery of the surface.

5. The connector of claim 1, wherein the second portion of the surface is stepped in relation to the first portion of the surface so that the second portion of the surface is located closer to the substrate than the first portion of the surface when the connector is mounted on the substrate.

6. The connector of claim 1, wherein the housing pocket walls that define the first pocket comprise four adjoining surfaces each angled approximately thirty degrees in relation to an axis extending through the first pocket and equally spaced from the four adjoining surfaces.

7. The connector of claim 1, wherein the first and second fusible elements are solder balls.

8. The connector of claim 1, wherein the spacing between the first fusible element and the housing pocket walls that define the first pocket is for facilitating relative movement between the housing and the substrate when the connector is mounted on the substrate.

9. The connector of claim 1, wherein the pocket walls are angled.

10. The connector of claim 1, wherein the second portion of the surface is offset from the first portion of the surface by approximately 0.13 mm.

11. The connector of claim 10, wherein the gap is approximately 0.065 mm.

12. A ball-grid array connector, comprising:
  a housing having a first portion and a second portion, the first portion being recessed relative to the second portion, and one or more pocket walls, disposed in the first portion, that define a pocket;
  a first contact that is disposed in the pocket and that has an end that extends out of the pocket; and
  a fusible element attached to the first contact end so that there is a gap between the fusible element and the first portion,
  wherein the second portion is offset from the recessed portion, the housing further comprises one or more pocket walls that define a second pocket within the housing, and the connector further comprises a second contact having a contact end that is disposed in the second pocket, and a second fusible element attached to the second contact end, extending into the second pocket and contacting the one or more pocket walls that define the second pocket within the housing, and
  wherein the ends of the first and the second contacts are substantially coplanar.

13. The connector of claim 12, wherein the fusible element is capable of forming a connection between the first contact and a substrate when the fusible element is placed on the substrate and subjected to a reflow process, and the gap between the fusible element and the first portion facilitates relative movement between the housing and the connection.

14. The connector of claim 12, wherein the first portion is positioned outward of the second portion.

15. The connector of claim 12, wherein the pocket walls comprise four adjoining surfaces each angled approximately thirty degrees in relation to an axis extending through the pocket and equally spaced from the four adjoining surfaces.

16. An electrical connector for mounting on a substrate, comprising:
  a first and a second contact;
  a first and a second fusible element respectively connected to the first and the second contacts; and
  a housing having a first portion and a second portion, the first and second contacts being mounted on the housing so that the first and second contacts extend through penetrations associated within the respective first and second portions, wherein the first portion is recessed in relation to the second portion so that there is gap between the first fusible element and the housing whereby the connection formed by the first fusible element can deflect in relation to the housing in response to relative movement between the housing and the substrate, wherein the penetrations are pockets formed in the housing, the connection formed by the second fusible element extends into the penetration associated with the second portion, the pockets are defined by angled pocket walls, and ends of first and the second contacts are substantially coplanar.

17. A ball-grid array connector, comprising:

a housing comprising a first and a second portion, the thickness of the first portion being less than the thickness of the second portion, the first portion having a first pocket defined by angled walls, and the second portion having a second pocket defined by angled walls;

a first contact disposed in the first pocket and having a contact end that extends outside of the first pocket;

a first fusible element attached to the first contact end and being disposed outside of the first pocket;

a second contact disposed in the second pocket and having a contact end that is disposed inside of the second pocket; and a second fusible element attached to the second contact end, at least a portion of the second fusible element being disposed in the second pocket;

wherein the first contact ends are substantially coplanar with the second contact ends.

* * * * *